United States Patent

Kusano

[11] Patent Number: 5,703,523
[45] Date of Patent: Dec. 30, 1997

[54] FILTER CIRCUIT

[75] Inventor: Takahiro Kusano, Yokohama, Japan

[73] Assignee: Kabushiki Kaisha Toshiba, Kawasaki, Japan

[21] Appl. No.: 641,076

[22] Filed: Apr. 26, 1996

[30] Foreign Application Priority Data

Apr. 26, 1995 [JP] Japan .................. 7-102752

[51] Int. Cl.$^6$ .................. H03K 5/01; H03K 5/125
[52] U.S. Cl. .................. 327/553; 327/555; 330/305; 330/306
[58] Field of Search .................. 327/551, 552, 327/553, 554, 560, 561, 562, 563, 555, 556, 557; 330/109, 107, 303, 306, 294, 305

[56] References Cited

U.S. PATENT DOCUMENTS

| 3,792,367 | 2/1974 | Fleischer et al. | 330/98 |
| 4,719,512 | 1/1988 | Endo et al. | 358/213 |
| 4,851,718 | 7/1989 | Hagino et al. | 327/561 |
| 5,192,884 | 3/1993 | Kusano | 327/552 |
| 5,317,217 | 5/1994 | Rieger et al. | 327/552 |
| 5,489,873 | 2/1996 | Kamata et al. | 330/294 |
| 5,610,551 | 3/1997 | Hosoya | 327/552 |

FOREIGN PATENT DOCUMENTS 06338759 12/1994 Japan.

OTHER PUBLICATIONS

Patent Abstracts of Japan, vol. 16, No. 492 (E-1278), Oct. 12, 1992 JP-A-4 180405.

Patent Abstracts of Japan, vol. 16, No. 579 (E-1299), Dec. 18, 1992 JP-A-4 230110.

Primary Examiner—Timothy P. Callahan
Assistant Examiner—Terry L. Englund
Attorney, Agent, or Firm—Oblon, Spivak, McClelland, Maier & Neustadt, P.C.

[57] ABSTRACT

A filter circuit having a signal input terminal and a signal output terminal includes a first and a second buffer. The first buffer has an input end connected to a first resistor and to a first capacitor. A second capacitor having one end is connected to an output end of the first buffer. A second resistor having one end is connected to the signal input terminal. The second buffer has an input end connected to the other end of the second resistor and to the other end of the second capacitor, and an output end connected to the signal output terminal. The filter circuit also includes a first signal supply circuit and a second signal supply circuit. The first signal supply circuit supplies a signal proportional to a difference between an output signal of the second buffer and a signal inputted from the signal input terminal, to the input end of the first buffer through the first resistor. The second signal supply circuit supplies a signal proportional to the signal inputted from the signal input terminal, to the input end of the first buffer through the first capacitor.

4 Claims, 8 Drawing Sheets

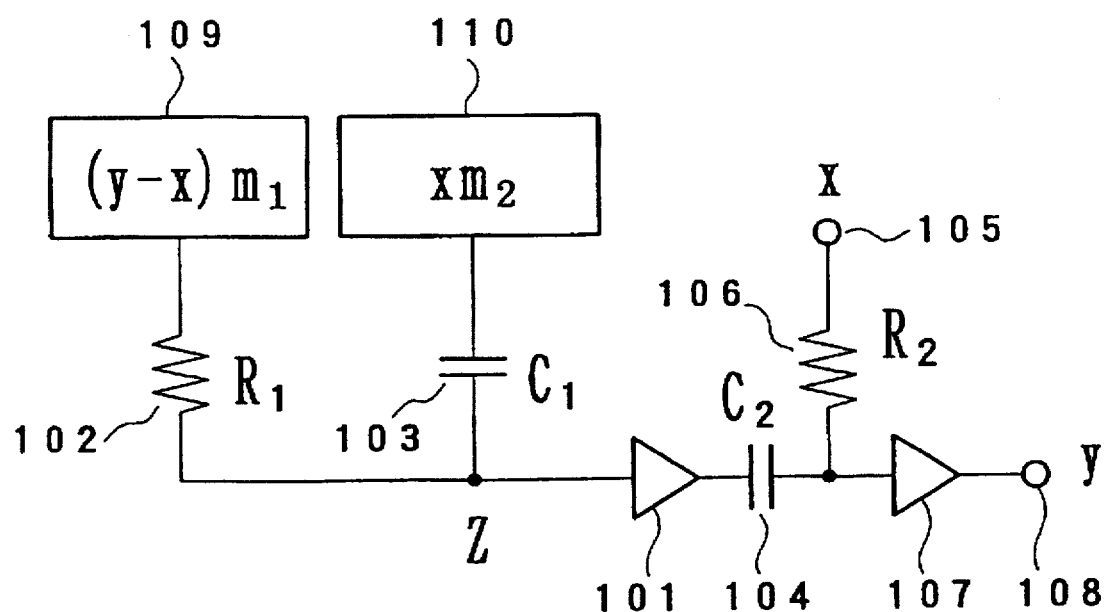
F I G. 4

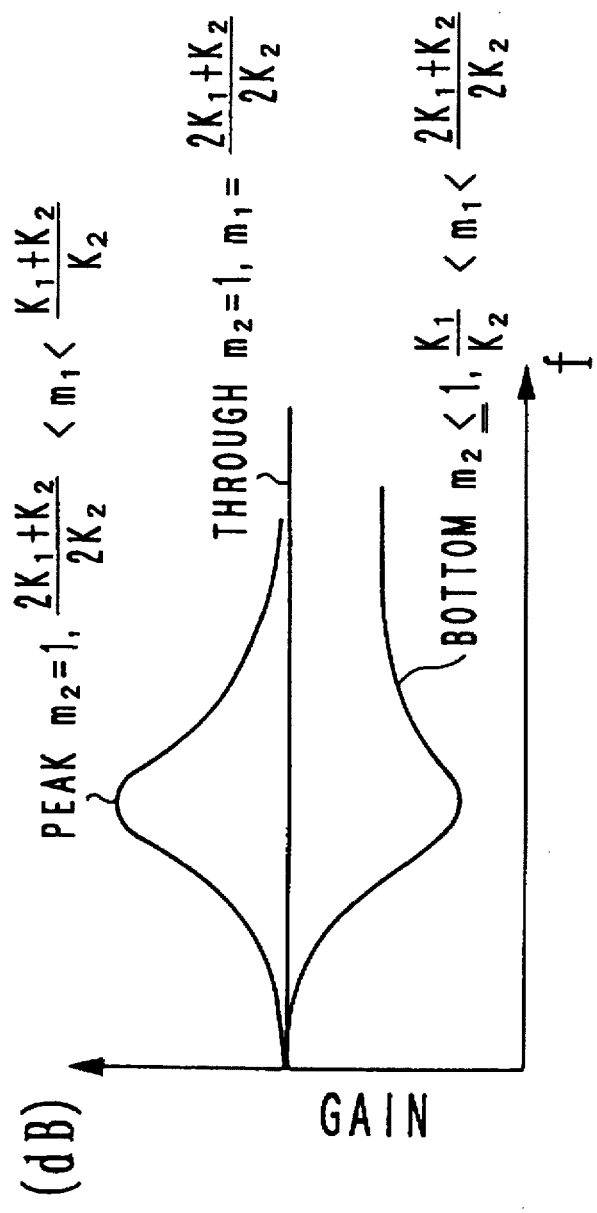
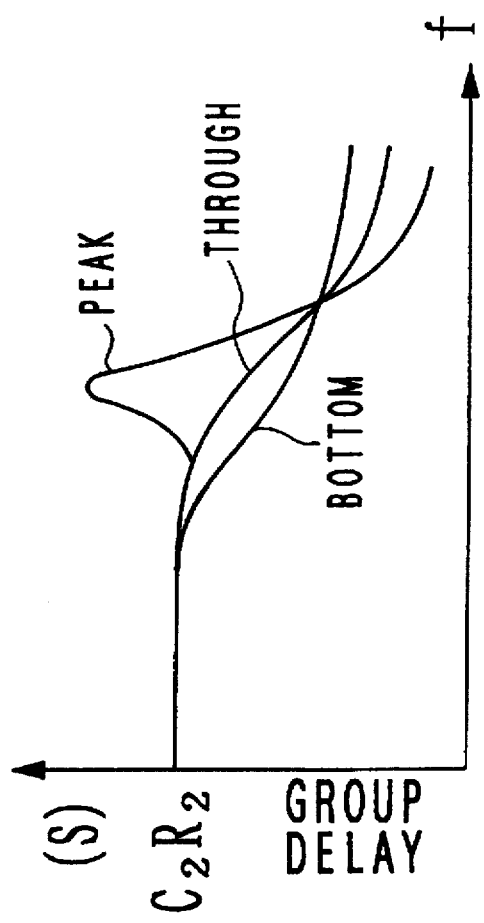
FIG. 5A
FIG. 5B

FILTER CIRCUIT

BACKGROUND OF THE INVENTION

The present invention relates to a filter circuit suitable for use with a picture quality adjusting circuit provided for a VTR (video tape recorder), for instance.

An example of conventional filter circuits used for the picture quality adjusting circuit in a VTR will be explained hereinbelow with reference to the attached drawings.

FIG. 1 is a circuit diagram of a conventional filter circuit. In the drawing, the filter circuit is composed of two $g_m$ amplifiers 603 and 604 each for converting voltage to current, two variable gain amplifiers 605 and 607 each for changing gain, a NOT gate 608, an adder 609, and two capacitors 610 and 606.

A non-inversion (+) input end of the $g_m$ amplifier (whose mutual conductance is $g_{m1}$) 603 is connected to a signal input terminal 601, and an inversion (−) input end of the same $g_m$ amplifier 603 is connected to an output end of the $g_m$ amplifier (whose mutual conductance is $g_{m2}$) 604 and a signal output terminal 602. Further, a non-inversion (+) input end of the $g_m$ amplifier 604 is connected to an output end of the $g_m$ amplifier 603, and an inversion (−) input end of the $g_m$ amplifier 604 is connected to the signal output terminal 602.

Further, an input end of the variable gain amplifier 605 (whose gain is m) is connected to the signal input terminal 601, and an output end of the same variable gain amplifier 605 is connected to the signal output terminal 602 via a capacitor (whose capacitance is $C_2$) 606. Further, a non-inversion (+) input end of the variable gain amplifier 607 (whose gain is n) 607 is connected to the output end of the $g_m$ amplifier 604, and an inversion (−) input end of the same variable gain amplifier 607 is connected to the signal input terminal 601. Further, an input end of the NOT gate 608 is connected to the output end of the $g_m$ amplifier 604. Further, the outputs of the variable gain amplifier 607 and the NOT gate 608 are both connected to two input ends of the adder 609, respectively. An output end of this adder 609 is connected to the non-inversion (+) input end of the $g_m$ amplifier 604 and the output end of the $g_m$ amplifier 603 via capacitor (whose capacitance is $C_1$) 610.

In the filter circuit as shown in FIG. 1, when the input signal value is denoted by x; the output signal value is denoted by y; and the voltage value of the non-inversion (+) input end of the $g_m$ amplifier 604 is denoted by z, the following formulae (1) can be established:

$$Z = (x-y)\frac{g_{m1}}{s \cdot C_1} + (y-x)n - y \quad (1)$$

$$y = (z-y)\frac{g_{m2}}{s \cdot C_2} + mx$$

where $s = j\omega$

Here, a transfer function H can be obtained on the basis of the above formulae (1) as follows:

$$H_{(s)} = \frac{ms^2 - n\frac{g_{m2}}{C_2} \cdot s + \frac{g_{m1} \cdot g_{m2}}{C_1 \cdot C_2}}{s^2 + (2-n)\frac{g_{m2}}{C_2} \cdot s + \frac{g_{m1} \cdot g_{m2}}{C_1 \cdot C_2}} \quad (2)$$

Further, the filter gain characteristics and the group delay characteristics of the filter circuit can be obtained on the basis of the above formula (2) as follows:

$$G_{(\omega)} = \sqrt{\frac{\left(\frac{g_{m1} \cdot g_{m2}}{C_1 \cdot C_2} - m\omega^2\right)^2 + n^2\left(\frac{g_{m2}}{C_2}\omega\right)^2}{\left(\frac{g_{m1} \cdot g_{m2}}{C_1 \cdot C_1} - \omega^2\right)^2 + (2-n)^2\left(\frac{g_{m2}}{C^2}\omega\right)^2}} \quad (3)$$

$$\tau(\omega) = \quad (4)$$

$$(2-n)\frac{g_{m2}}{C_2} \cdot \frac{\frac{g_{m1} \cdot g_{m2}}{C_1 \cdot C_2} + \omega^2}{\left(\frac{g_{m1} \cdot g_{m2}}{C_1 \cdot C_2} - \omega^2\right)^2 + (2-n)^2\left(\frac{g_{m2}}{C^2}\omega\right)^2} +$$

$$n\frac{g_{m2}}{C_1} \times \frac{\frac{g_{m1} \cdot g_{m2}}{C_1 \cdot C_2} + m\omega^2}{\left(\frac{g_{m1} \cdot g_{m2}}{C_1 \cdot C_2} - m\omega^2\right)^2 + n^2\left(\frac{g_{m2}}{C^2}\omega\right)^2}$$

Further, a group delay rate τ of when the frequency is zero hertz can be obtained on the basis of the above formula (4) as follows:

$$\tau_{(0)} = \frac{C_1}{g_{m1}}\{(2-n)+n\} = \frac{2C_1}{g_{m1}} \quad (5)$$

The above formula (5) indicates that when the frequency is zero hertz, the group delay rate τ is determined constant irrespective of the gains m and n of the two variable gain amplifiers 605 and 607. This implies that whenever the aperture control (APCONT) is adjusted for picture quality adjustment, the signal delay time hardly changes.

FIG. 2A represents the gain characteristics obtained in accordance with the formula (3), and FIG. 2B represents the group delay characteristics obtained in accordance with the formula (4), respectively.

As understood by FIG. 2A, when the gain m is determined as 1 (m=1) and further the gain n is changed in a range from 1 to 2 ($1 \leq n \leq 2$), the gain characteristics of the filter circuit shown in FIG. 1 have a peak value at a predetermined frequency. Further, when the two gains are determined as m=1 and n=1, the gain characteristics are all-pass characteristics. Further, when the two gains are determined as m<1 and n<1, the gain characteristics have a curve having a bottom value.

On the other hand, as understood by FIG. 2B, the group delay characteristics of the filter circuit are constant in a low frequency range.

However, the conventional filter circuit as described above involves the following drawbacks.

As explained with reference to FIG. 1, the conventional filter circuit has two $g_m$ amplifiers 603 and 604. In more detail, FIG. 3 is a circuit diagram showing an example of the $g_m$ amplifier. As shown, a single $g_m$ amplifier consists of six bipolar transistors 801 to 806, two resistors 807 and 808, and three constant current circuits 809 to 811.

There exists such a problem in that the number of elements are large and thereby the area occupied by the $g_m$ amplifiers is relatively broad.

To overcome this problem, it may be possible to reduce the area occupied by the filter circuit by decreasing the capacitance values of the two capacitors 606 and 610 of FIG. 1.

In this case, however, another problem arises as follows: Here, the coefficients of the filter circuit can be decided on the basis of $g_{m2}/C_2$ and $(g_{m1} \cdot g_{m2})/(C_1 \cdot C_2)$ in accordance with the transfer function as expressed by the formula (2).

Accordingly, in order to reduce the capacitances of the two capacitors 606 and 610, it is necessary to also reduce the mutual conductances $g_{m1}$ and $g_{m2}$. Therefore, the $g_m$ amplifier as shown in FIG. 3 is constructed in such a way that the input signal can be compressed by $r_e/(R+2r_e)$ times on the basis of the four bipolar transistors 801, 802, 805 and 806 and two resistors 807 and 808. Here, $r_e$ is an emitter resistance value of each of the bipolar transistors 801, 802, 805 and 806 and R is a resistance value of each of the resistors 807 and 808. As described above, since capacitances of the capacitors 606 and 610 can be increased by $r_e/(R+2r_e)$ times, it is possible to reduce the area occupied by these capacitors 606 and 610 to that extent.

In this case, however, in the $g_m$ amplifier as shown in FIG. 3, since thermal noise caused by the resistors 807 and 808 is inevitably superimposed upon the signal compressed by the bipolar transistors 801 and 802 and 805 and 806, the S/N ratio of the filter circuit increases with increasing compression ratio. In other words, when the filter area is reduced by decreasing the area occupied by the capacitors 606 and 610, there exists a problem in that the S/N ratio of the filter circuit is lowered.

SUMMARY OF THE INVENTION

With these problems in mind, therefore, it is the object of the present invention to provide a filter circuit having a small circuit area and an excellent S/N ratio, while securing the gain characteristics and group delay characteristics equivalent to the conventional filter circuit.

To achieve the above-mentioned object, the present invention provides a filter circuit having a signal input terminal and a signal output terminal, comprising: a first buffer having an input end connected to a first resistor and to a first capacitor; a second capacitor having one end connected to an output end of the first buffer; a second resistor having one end connected to the signal input terminal; a second buffer having an input end connected to the other end of the second resistor and to the other end of the second capacitor, and an output end connected to the signal output terminal; first signal supplying means for supplying a signal proportional to a difference between an output signal of the second buffer and a signal inputted from the signal input terminal, to the input end of the first buffer through the first resistor; and second signal supplying means for supplying a signal proportional to the signal inputted from the signal input terminal, to the input end of the first buffer through the first capacitor.

The first signal supplying means may include an inverter for inverting the signal inputted from the signal input terminal to output an inverted signal; an adder for adding the inverted signal and the output signal of the second buffer to output an added signal; and an amplifier for amplifying the added signal by a predetermined times to output an amplified signal, the amplified signal being supplied to the input end of the first buffer through the first resistor.

The first signal supplying means may include a differential amplifier having a non-inversion input end connected to the output end of the second buffer, and an inversion input end connected to the signal input terminal, an output signal of the differential amplifier being supplied to the input end of the first buffer through the first resistor.

The first resistor may consist of a third resistor and a fourth resistor connected in parallel to each other; and the first signal supplying means may include first signal amplifying means for amplifying the signal inputted from the signal input terminal to output a first amplified signal, the first amplified signal being supplied to the input end of the first buffer through the third resistor; and second signal amplifying means for amplifying the output signal of the second buffer to output a second amplified signal, the second amplified signal being supplied to the input end of the first buffer through the fourth resistor.

BRIEF DESCRIPTION OF THE DRAWINGS

FIG. 4 is a circuit diagram for assistance in explaining the concept of the filter circuit according to the present invention;

FIG. 5A is a graphical representation showing the gain characteristics of the filter circuit shown in FIG. 4, and FIG. 5B is a graphical representation showing the group delay characteristics of the same circuit;

DETAILED DESCRIPTION OF THE PREFERRED EMBODIMENTS

Figure 1:
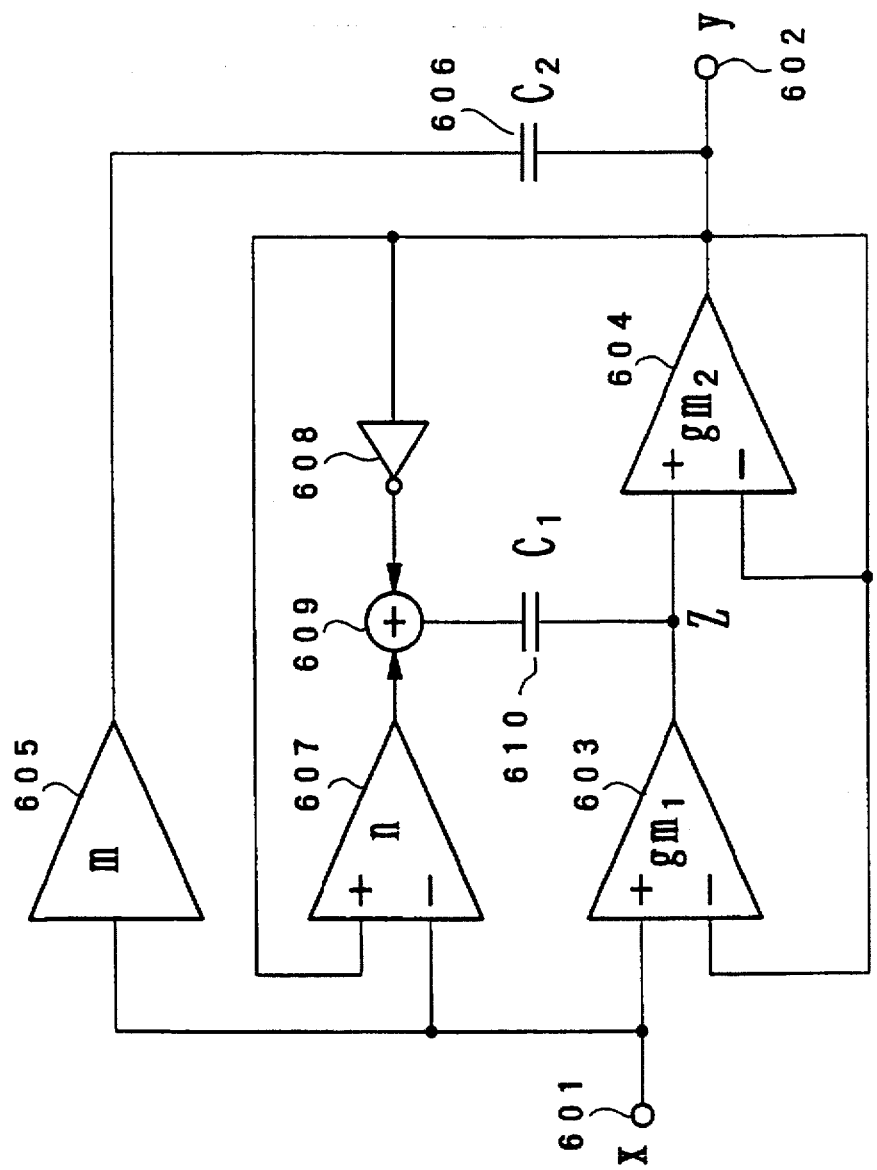
FIG. 1 is a circuit diagram showing an example of a conventional filter circuit.
Figure 2A:
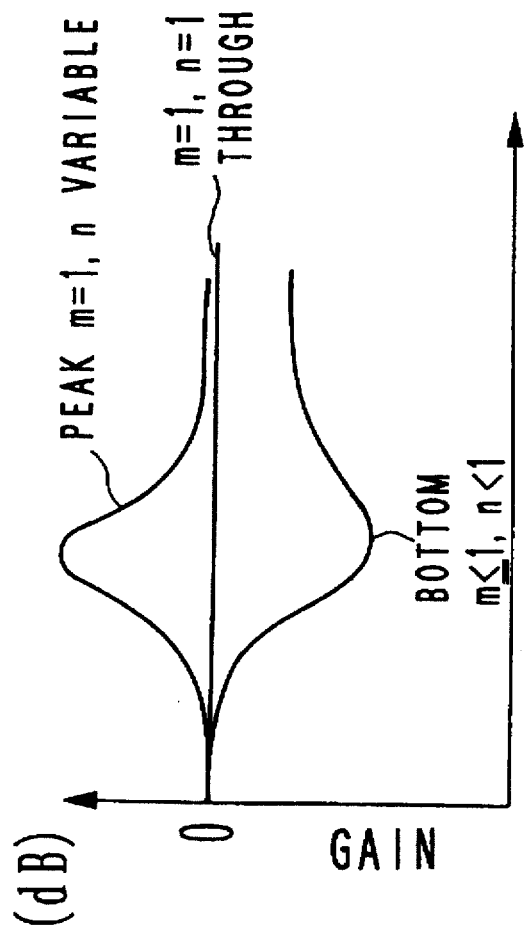
FIG. 2A is a graphical representation showing the gain characteristics of the prior art filter circuit shown in FIG. 1.
Figure 2B:
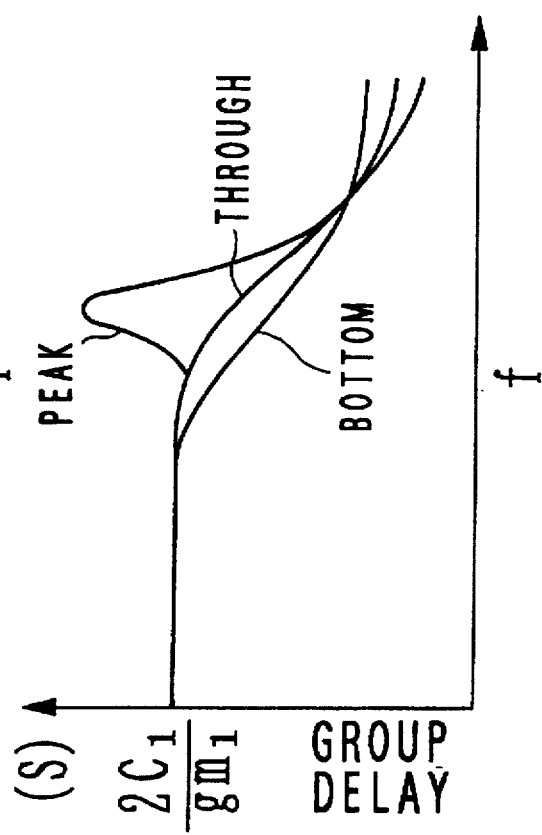
FIG. 2B is a graphical representation showing the group delay characteristics of the same circuit.

The embodiments of the filter circuit according to the present invention will be described hereinbelow with reference to the attached drawings.

FIG. 4 is a circuit diagram for assistance in explaining the concept of the filter circuit according to the present invention.

As shown, an input end of a first buffer 101 is connected to one end of a first resistor ($R_1$) 102 and an end of a first capacitor ($C_1$) 103. Further, an output end of this buffer 101 is connected to an end of a second capacitor ($C_2$) 104. An end of a second resistor (R2) 106 is connected to a signal input terminal 105.

An input end of a second buffer 107 is connected to the other end of the second capacitor ($C_2$) 104 and the other end of the second resistor ($R_2$) 106. Further, an output end of the second buffer 107 is connected to a signal output terminal 108.

A first signal supplying section 109 amplifies a difference in voltage level between an input signal x of the signal input terminal 105 and an output signal y of the signal output terminal 108 (i.e., the output end of the second buffer 107) by $m_1$ times and supplies the amplified signal to the input end of the first buffer 101 via the first resistor ($R_1$) 102.

Further, a second signal supplying section 110 amplifies the input signal x of the signal input terminal 105 by $m_2$ times and supplies the amplified signal to the input end of the first buffer 101 via the first capacitor ($C_1$) 103.

In the buffer circuit as constructed above, when the signal applied to the input end of the first buffer 101 is denoted by z, the following relationship can be established among the input signal x, the output signal y and the buffer input signal z:

$$Z = \frac{\frac{y-x}{R_1} m_1 + sC_1 m_2 x}{\frac{1}{R_1} + sC_1} \quad (6)$$

$$= \frac{(y-x)m_1 + sk_1 m_2 x}{1 + sk_1}$$

$$y = \frac{\frac{x}{R_2} + sC_2 z}{\frac{1}{R_2} + sC_2} = \frac{x + sk_2 z}{1 + sk_2}$$

where $R_1$ and $R_2$ denote the resistance values of the first and second resistors 102 and 106, and $C_1$ and $C_2$ denote the capacitance values of the first and second capacitors 103 and 104. Further, $k_1 = C_1 \cdot R_1$, $k_2 = C_2 \cdot R_2$, and $s = j\omega$.

Here, a transfer function H can be obtained on the basis of the above formulae (6) as follows:

$$H_{(s)} = \frac{y}{x} = \frac{s^2 k_1 k_2 m_2 + s(k_1 - k_2 m_1) + 1}{s^2 k_1 k_2 (k_1 + k_2 - k_2 m_1) + 1} \quad (7)$$

Further, the gain characteristics and the group delay characteristics of the filter circuit according to the present invention can be obtained on the basis of the above formula (7) as follows:

$$G_{(\omega)} = \sqrt{\frac{(1 - k_1 k_2 m_2 \omega^2)^2 + s(k_1 - k_2 m_1)^2 \omega^2}{(1 - k_1 k_2 \omega^2)^2 + (k_1 + k_2 - k_2 m_1)^2 \omega^2}} \quad (8)$$

$$\tau_{(\omega)} = (k_1 + k_2 - k_2 m_1) \frac{1 - k_1 + k_2 \omega^2}{(1 - k_1 k_2 \omega^2)^2 + (k_1 + k_2 - k_2 m_1)^2 \omega^2} - \quad (9)$$

$$(k_1 - k_2 m_1) \frac{1 + k_1 + k_2 m_2 \omega^2}{(1 - k_1 k_2 m_2 \omega^2)^2 + (k_1 - k_2 m_1)^2 \omega^2}$$

Further, a group delay rate $\tau$ of when the frequency is zero hertz can be obtained on the basis of the above formula (9) as follows:

$$\tau_{(0)} = (k_1 + k_2 - k_2 m_1) - (k_1 - k_2 - k_2 m_1) = k_2 = C_2 R_2 \quad \ldots (10)$$

The above formula (10) indicates that when the frequency is zero hertz, the group delay rate $\tau_{(0)}$ is determined constant irrespective of the gains $m_1$ and $m_2$ of the first and second signal supplying sections 109 and 110.

FIG. 5A represents the gain characteristics obtained in accordance with the formula (8), and FIG. 5B represents the group delay characteristics obtained in accordance with the formula (9), respectively.

As understood by FIG. 5A, the gain characteristics of the filter circuit as shown in FIG. 4 have a peak value at a predetermined frequency under the following conditions:

$$m_2 = 1, \frac{2k_1 + k_2}{2k_2} < m_1 < \frac{k_1 + k_2}{k_2}$$

Further, the gain characteristics of the same filter circuit are the all-pass characteristics under the following conditions:

$$m_2 = 1 \quad m_1 = \frac{2k_1 + k_2}{2k_2}$$

Further, the gain characteristics of the same filter circuit have a curve having a bottom value under the following conditions:

$$m_2 \leq 1 \frac{k_1}{k_2} < m_1 < \frac{2k_1 + k_2}{2k_2}$$

On the other hand, as understood by FIG. 5B, the group delay characteristics of the filter circuit as shown in FIG. 4 is constant.

Further, as understood by above, the peak value and the bottom value of the gain characteristics can be adjusted by changing the gain $m_1$, and the attenuation rate of the gain characteristics can be adjusted by changing the gain $m_2$.

In comparison between the conventional filter circuit as shown in FIG. 1 and the filter circuit according to the present invention as shown in FIG. 4, both the gain and group delay characteristics shown in FIGS. 2A and 2B, and 5A and 5B are quite similar with respect to each other. In other words, by use of the filter circuit according to the present invention, it is possible to obtain quite the same characteristics as those of the conventional filter circuit.

A practical circuit construction of a first embodiment of the filter circuit according to the present invention will be described hereinbelow with reference to FIG. 6, in which the similar reference numerals have been retained for similar circuit elements having the same functions as with the case of the conceptional circuit shown in FIG. 4.

Figure 6:
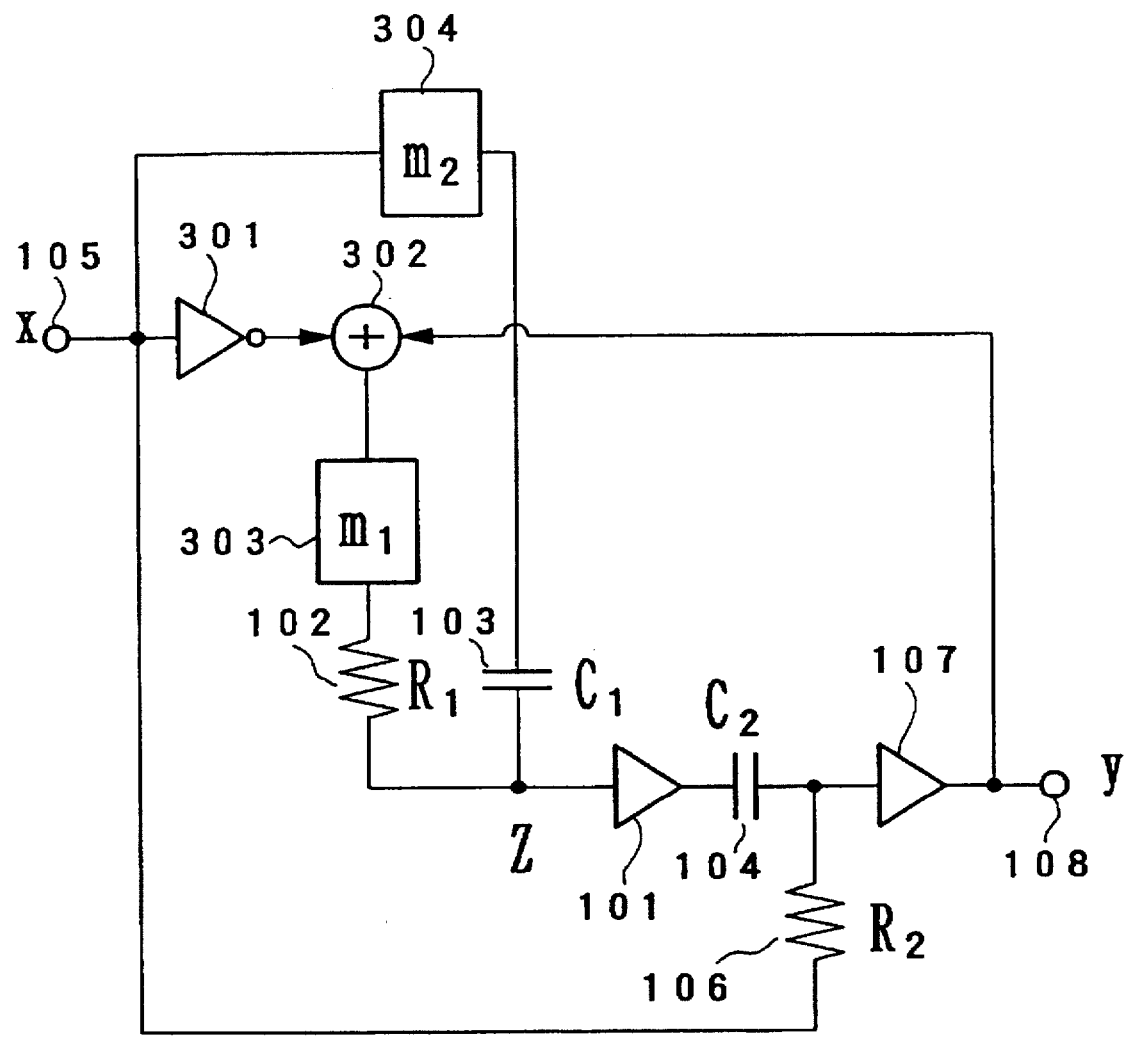
FIG. 6 is a circuit diagram showing a first embodiment of the filter circuit according to the present invention.

In FIG. 6, the first signal supplying section 109 shown in FIG. 4 is constructed by a NOT gate (inverter) 301, an adder 302, and a variable gain amplifier 303. In more detail, the NOT gate 301 inverts the signal x applied to its input end from the signal input terminal 105. The adder 302 adds the inverted output signal −x of the NOT gate 301 to an output signal y of the buffer 107, so that an addition signal (y−x) can be outputted by the adder 302. The variable gain amplifier 303 amplifies the output signal (y−x) of the adder 302 by $m_1$ times and supplies the amplified signal (y−x)$m_1$ to the buffer 101 via resistor ($R_1$) 102.

Further, the second signal supplying section 110 shown in FIG. 4 is constructed by a variable gain amplifier 304. In more detail, the variable gain amplifier 304 amplifies the output signal x applied to its input end from the signal input terminal 105 by $m_2$ times and supplies the amplified signal x$m_2$ to the input end of the buffer 101 via capacitor ($C_1$) 103.

According to the circuit construction as described above, it is possible to obtain the similar filter gain and group delay characteristics as expressed by the formulae (8) and (9) and shown by FIGS. 5A and 5B, which are equivalent as those of the conventional filter circuit as shown in FIG. 1.

In addition, in the filter circuit according to the present invention, since no $g_m$ amplifier is used, the number of elements which deteriorate S/N ratio can be reduced, as compared with the prior art filter circuit as shown in FIG. 1, with the result that it is possible to decrease the area occupied by the filter circuit.

A practical circuit construction of a second embodiment of the filter circuit according to the present invention will be described hereinbelow with reference to FIG. 7, in which the similar reference numerals have been retained for similar circuit elements having the same functions as with the case of the conceptional circuit shown in FIG. 4.

Figure 7:
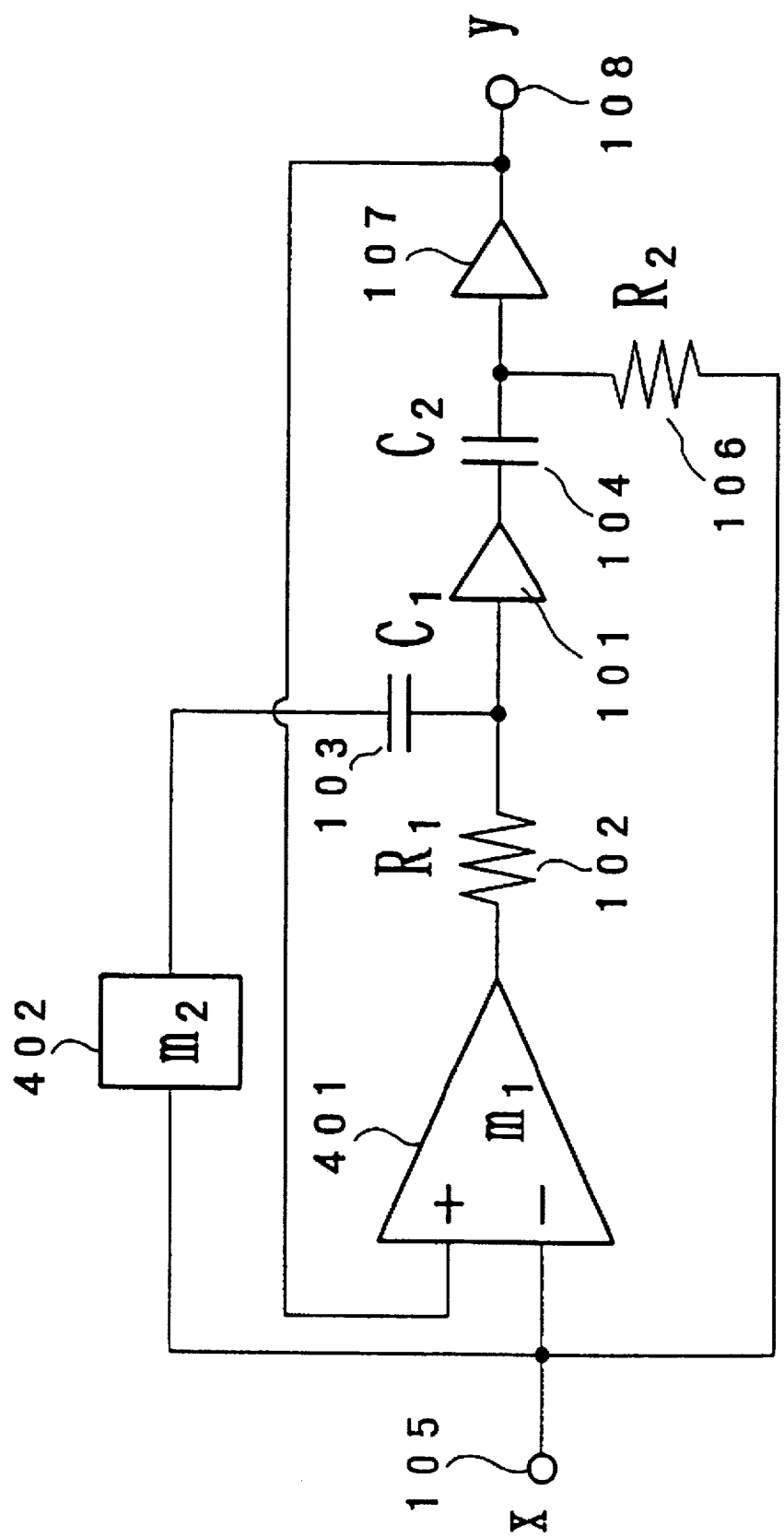
FIG. 7 is a circuit diagram showing a second embodiment of the filter circuit according to the present invention.

In FIG. 7, the first signal supplying section 109 shown in FIG. 4 is constructed by a differential amplifier 401. In more detail, the output signal y of the buffer 107 is inputted to a non-inversion (+) input end of the differential amplifier 401, and the signal x of the signal input terminal 105 is inputted to an inversion (−) input end of the differential amplifier 401. Therefore, the differential amplifier 401 amplifies a difference (y−x) between the output signal y of the buffer 107 and the input signal x of the signal input terminal 105 by $m_1$ times, and supplies the amplified signal $(y-x)m_1$ to the input end of the buffer 101 via resistor ($R_1$) 102.

Further, the second signal supplying section 110 shown in FIG. 4 is constructed by a variable gain amplifier 402. In more detail, the variable gain amplifier 402 amplifies the output signal x applied from the signal input terminal 105 by $m_2$ times and supplies the amplified signal $xm_2$ to the input end of the buffer 101 via capacitor ($C_1$) 103.

According to the circuit construction as described above, it is possible to obtain the similar filter gain and group delay characteristics as expressed by the formulae (8) and (9) and shown by FIGS. 5A and 5B, which are equivalent as those of the conventional filter circuit as shown in FIG. 1.

In addition, also in this filter circuit according to the present invention, since no $g_m$ amplifier is used, the number of elements which deteriorate S/N ratio can be reduced, as compared with the conventional filter circuit as shown in FIG. 1, with the result that it is possible to decrease the occupied area of the filter circuit.

A practical circuit construction of a third embodiment of the filter circuit according to the present invention will be described hereinbelow with reference to FIG. 8, in which the similar reference numerals have been retained for similar circuit elements having the same functions as with the case of the conceptional circuit shown in FIG. 4.

Figure 8:
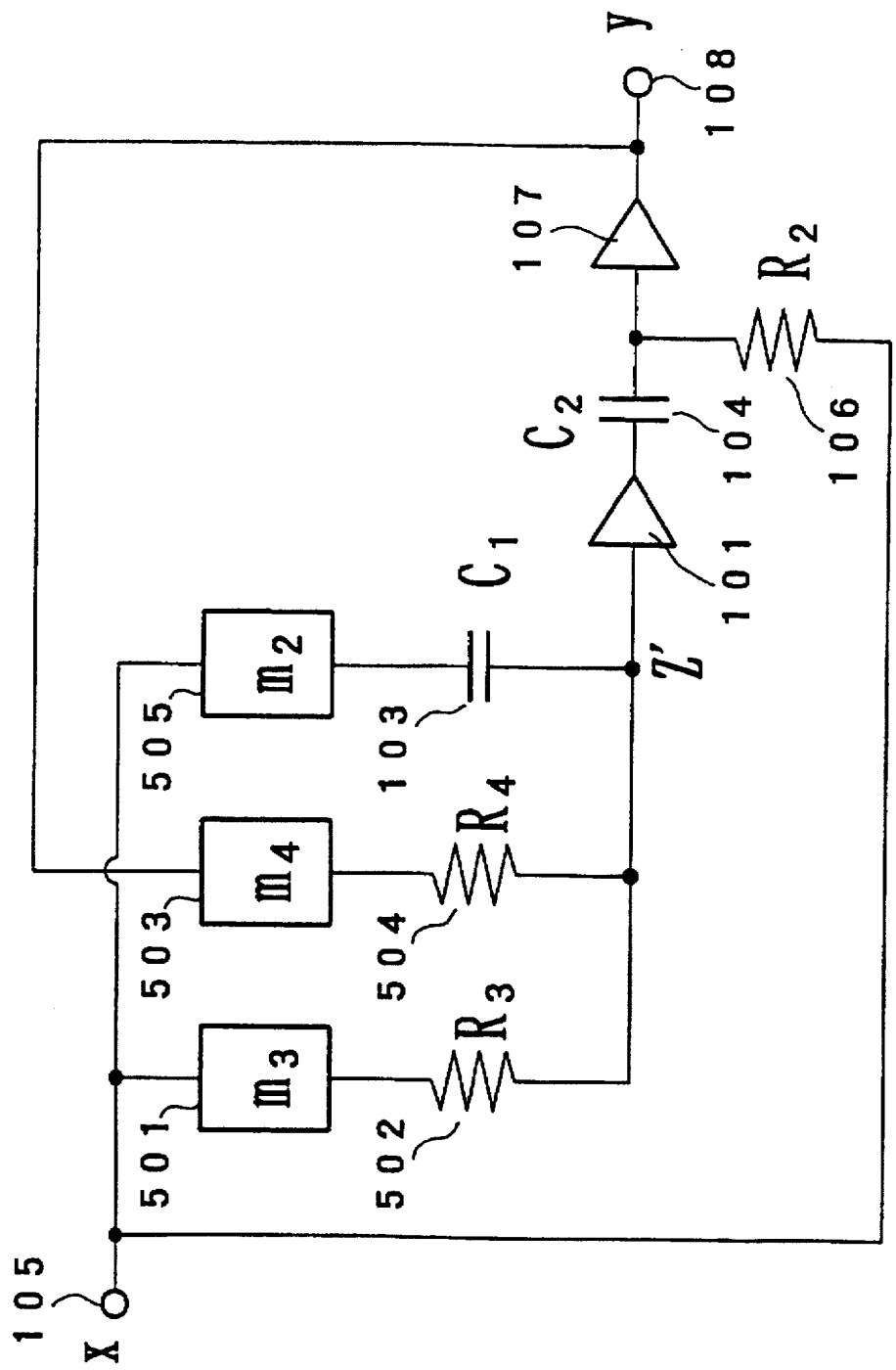
FIG. 8 is a circuit diagram showing a third embodiment of the filter circuit according to the present invention.

In FIG. 8, the first signal supplying section 109 shown in FIG. 4 is constructed by a variable gain amplifier 501 and another variable gain amplifier 503. In more detail, the variable gain amplifier 501 amplifies the input signal x of the signal input terminal 105 by $m_3$ times, and supplies the amplified signal to the input end of the buffer 101 via resistor ($R_3$) 502. The second variable gain amplifier 503 amplifies the output signal y of the buffer 107 by $m_4$ times, and supplies the amplified signal to the input end of the buffer 101 via resistor ($R_4$) 504.

Further, the second signal supplying section 110 shown in FIG. 4 is constructed by a variable gain amplifier 505. In more detail, the variable gain amplifier 505 amplifies the input signal x of the signal input terminal 105 by $m_2$ times and supplies the amplified signal $xm_2$ to the input end of the buffer 101 via capacitor ($C_1$) 103.

In the construction as described above, when the input signal of the first buffer 101 is denoted by z' and the resistance values of the resistors 502 and 504 are denoted by $R_3$ and $R_4$, respectively, the input signal z' can be represented by $$z' = \frac{\frac{m_3}{R_3}x + \frac{m_4}{R_4}y + sC_1 m_2 x}{\frac{1}{R_3} + \frac{1}{R_4} + sC_1} \quad (11)$$

Therefore, if $R_3=R_4=2R_1$, $m_3=-2m_1$ and $m_4=2m_1$, the input signal z' can be represented by $$z' = \frac{\frac{-2m_1}{2R_1}x + \frac{2m_1}{2R_1}y + sC_1 m_2 x}{\frac{1}{2R_1} + \frac{1}{2R_1} + sC_1} \quad (12)$$

$$= \frac{\frac{y-x}{R_1}m_1 + sC_1 m_2 x}{\frac{1}{R_1} + sC_1} \quad (12)$$

The above formula (12) is the same as the formula (6), so that the filter circuit as shown in FIG. 8 is equivalent to the filter circuit shown in FIG. 4.

According to the circuit construction as described above, it is possible to obtain the similar filter gain and group delay characteristics as expressed by the formulae (8) and (9) and shown by FIGS. 5A and 5B, which are equivalent as those of the conventional filter circuit as shown in FIG. 1.

Figure 3:
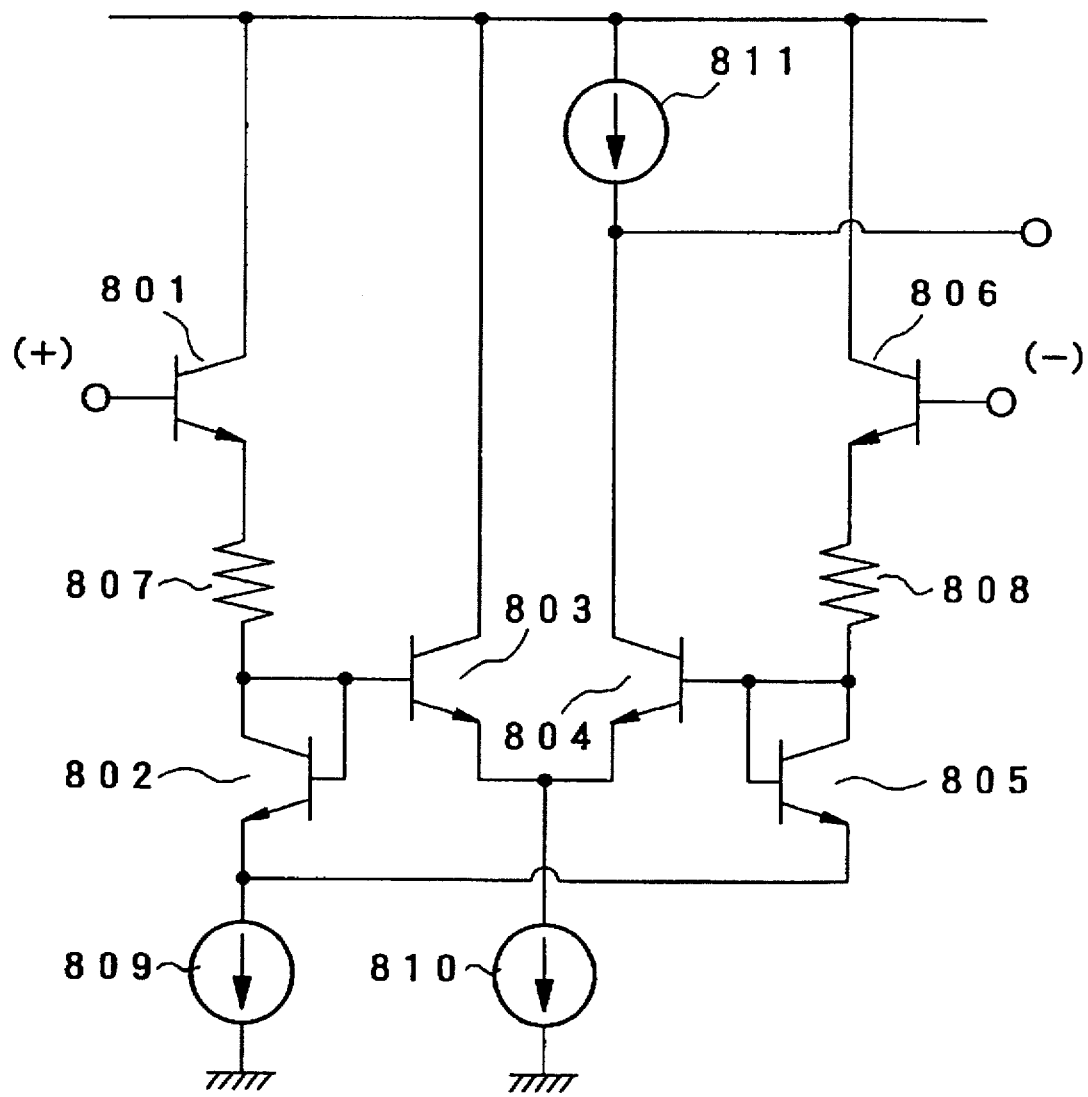
FIG. 3 is a circuit diagram showing an example of the $g_m$ amplifier shown in FIG. 1.

In addition, in the filter circuit according to the present invention, since no $g_m$ amplifier is used, the number of elements which deteriorate S/N ratio can be reduced, as compared with the conventional filter circuit as shown in FIG. 1, with the result that it is possible to decrease the occupied area of the filter circuit. The number of elements that consist of the conventional filter circuit shown in FIG. 1 is about 43 elements because two $g_m$ amplifiers (FIG. 3) are used. Contrary to this, since no $g_m$ amplifier is used, the number of elements that consist of the filter circuits shown in FIGS. 6, 7, and 8 are about 25, 20, and 27 elements, respectively.

As described above, in the filter circuit according to the present invention, it is possible to provide a filter circuit of a small circuit area and a high S/N ratio, without degrading the gain characteristics and the group delay characteristics of the filter circuit.

What is claimed is:

1. A filter circuit having a signal input terminal and a signal output terminal, comprising:

a first buffer having an input end connected to a first resistor and to a first capacitor;

a second capacitor having one end connected to an output end of the first buffer;

a second resistor having one end connected to the signal input terminal;

a second buffer having an input end connected to the other end of the second resistor and to the other end of the second capacitor, and an output end connected to the signal output terminal;

first signal supplying means for supplying a signal proportional to a difference between an output signal of the second buffer and a signal inputted from the signal input terminal, to the input end of the first buffer through the first resistor; and second signal supplying means for supplying a signal proportional to the signal inputted from the signal input terminal, to the input end of the first buffer through the first capacitor.

2. The filter circuit of claim 1, wherein the first signal supplying means comprises:

an inverter for inverting the signal inputted from the signal input terminal to output an inverted signal;

an adder for adding the inverted signal and the output signal of the second buffer to output an added signal; and an amplifier for amplifying the added signal by a predetermined amount to output an amplified signal, the amplified signal being the proportional signal supplied to the input end of the first buffer through the first resistor.

3. The filter circuit of claim 1, wherein the first signal supplying means includes a differential amplifier having a non-inversion input end connected to the output end of the second buffer, and an inversion input end connected to the signal input terminal, an output signal of the differential amplifier being the proportional signal supplied to the input end of the first buffer through the first resistor.

4. The filter circuit of claim 1, wherein the first resistor consists of a third resistor and a fourth resistor connected in parallel to each other; and the first signal supplying means includes first signal amplifying means for amplifying the signal inputted from the signal input terminal to output a first amplified signal, the first amplified signal being supplied to the input end of the first buffer through the third resistor; and second signal amplifying means for amplifying the output signal of the second buffer to output a second amplified signal, the second amplified signal being supplied to the input end of the first buffer through the fourth resistor wherein the first and second amplified signals comprise the proportional signal.

* * * * *